(12) United States Patent
Kazi et al.

(10) Patent No.: US 9,113,557 B2
(45) Date of Patent: Aug. 18, 2015

(54) JUNCTION BOX

(75) Inventors: Iqbal Kazi, Hertfordshire (GB); Peter Comiskey, Hertfordshire (GB); Frederic Tual, Hatfield (GB)

(73) Assignee: YAZAKI EUROPE LIMITED, Hertfordshire (GB)

( * ) Notice: Subject to any disclaimer, the term of this patent is extended or adjusted under 35 U.S.C. 154(b) by 497 days.

(21) Appl. No.: 12/742,365

(22) PCT Filed: Nov. 26, 2008

(86) PCT No.: PCT/GB2008/003937
§ 371 (c)(1),
(2), (4) Date: Sep. 30, 2010

(87) PCT Pub. No.: WO2009/068867
PCT Pub. Date: Jun. 4, 2009

(65) Prior Publication Data
US 2011/0061930 A1    Mar. 17, 2011

(30) Foreign Application Priority Data
Nov. 27, 2007 (GB) .................................. 0723213.5

(51) Int. Cl.
*H05K 7/20* (2006.01)
*H05K 1/02* (2006.01)
*H05K 3/46* (2006.01)

(52) U.S. Cl.
CPC ............ *H05K 1/0265* (2013.01); *H05K 1/0201* (2013.01); *H05K 1/0204* (2013.01); *H05K 1/0209* (2013.01); *H05K 3/4694* (2013.01); *H05K 2201/0352* (2013.01); *H05K 2201/062* (2013.01); *H05K 2201/09972* (2013.01)

(58) Field of Classification Search
CPC .. H05K 1/0201; H05K 1/0204; H05K 1/0209
USPC ......................................................... 174/547
See application file for complete search history.

(56) References Cited

U.S. PATENT DOCUMENTS 5,949,098 A * 9/1999 Mori .............................. 257/211
2002/0159225 A1 * 10/2002 Takahara ....................... 361/679
(Continued)

FOREIGN PATENT DOCUMENTS

| EP | 0052738 | 6/1982 |
| EP | 1253814 | 10/2002 |
| EP | 1549121 | 6/2005 |

*Primary Examiner* — William H Mayo, III
*Assistant Examiner* — Hiram E Gonzalez
(74) *Attorney, Agent, or Firm* — Welsh Flaxman & Gitler LLC

(57) ABSTRACT

A junction box, comprising a multi-layer circuit board, wherein the circuit board (6) comprises: a plurality of dielectric layers, each having conducting track on a side and arranged one on top of another to form the multi-layered circuit board; power circuitry (4) mounted on the circuit board; signal processing circuitry (5) mounted on the circuit board; and a power input for inputting electrical power into the circuitry on the circuit board, wherein the electrical power is transferred through conducting track (12) arranged to be on an inner dielectric layer, the conducting track on the inner dielectric layer being thicker than the conducting track arranged on the outer dielectric layers, and wherein the power circuitry is arranged on one region of the circuit board and the signal processing circuitry is arranged on another region of the circuit board, the two regions being thermally isolated by a thermal dam (9).

15 Claims, 12 Drawing Sheets

(56) References Cited

U.S. PATENT DOCUMENTS

| | | |
|---|---|---|
| 2002/0166690 A1 | 11/2002 | Chiriku et al. |
| 2005/0140434 A1* | 6/2005 | Abe et al. .................. 330/66 |
| 2005/0183882 A1* | 8/2005 | Yun et al. .................. 174/250 |
| 2006/0243478 A1* | 11/2006 | Inagaki et al. ............. 174/255 |

* cited by examiner

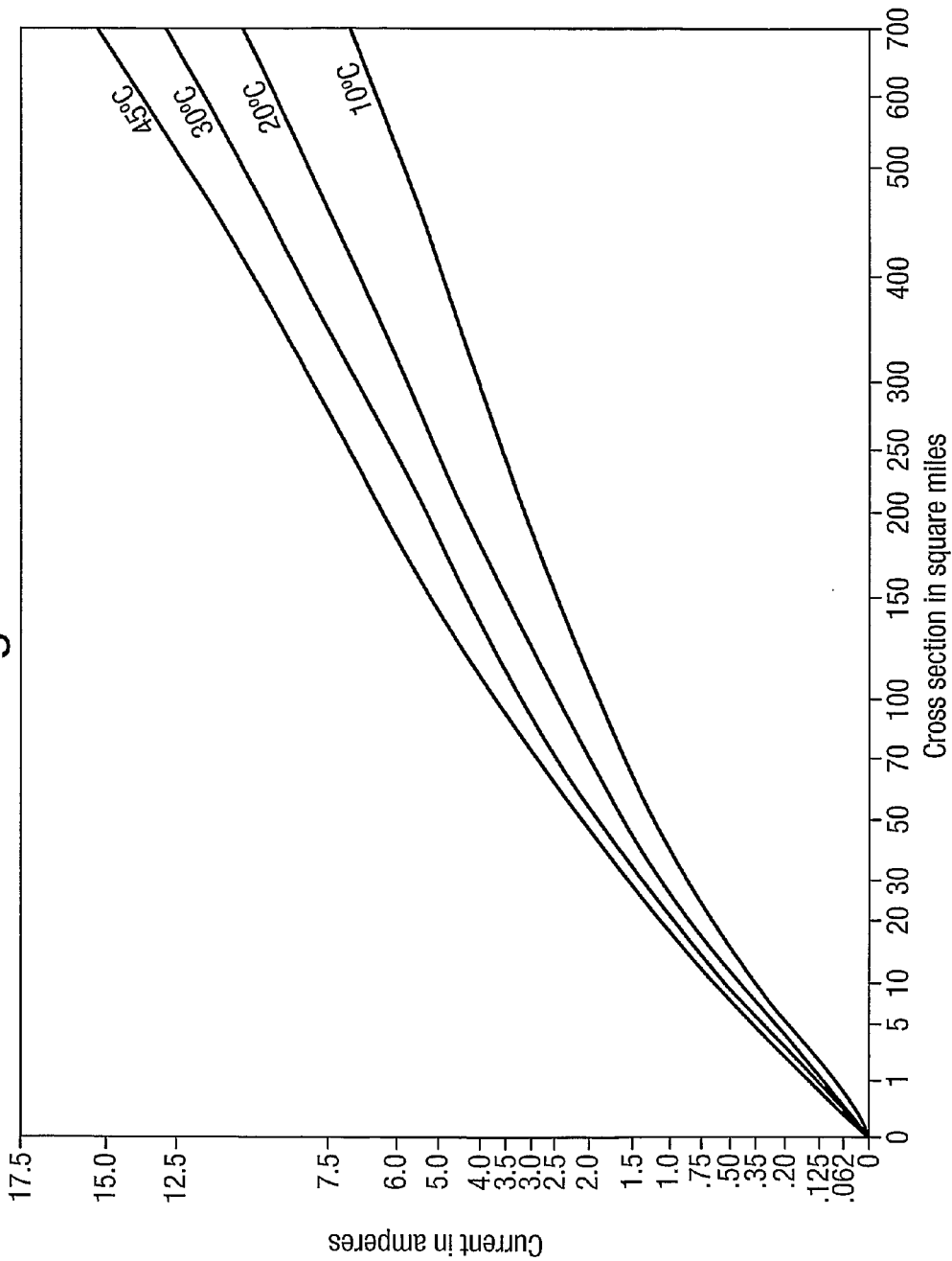

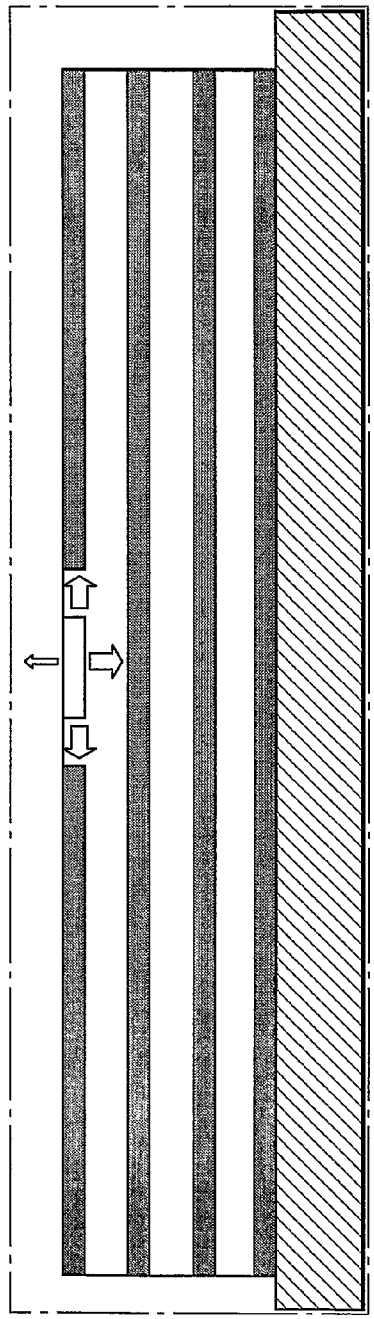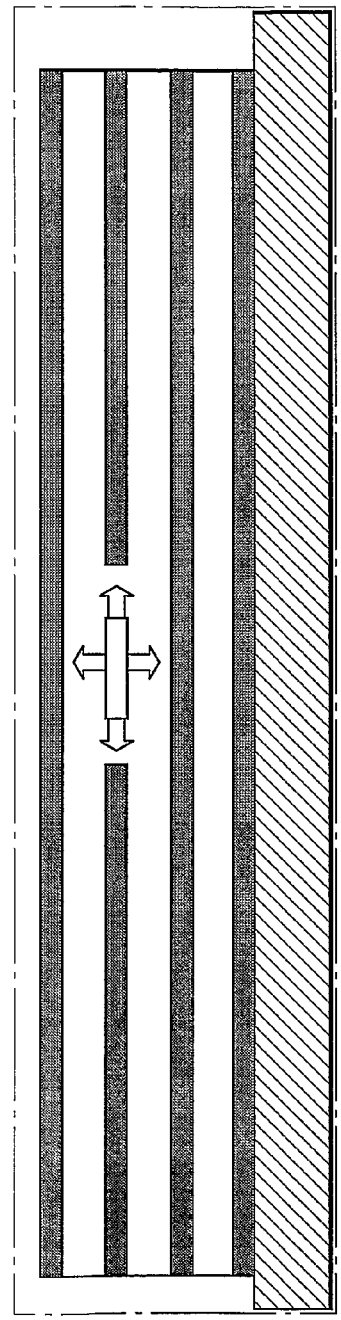

Artwork
Copper pattern
Base Material

35μm
70μm
105μm
175μm

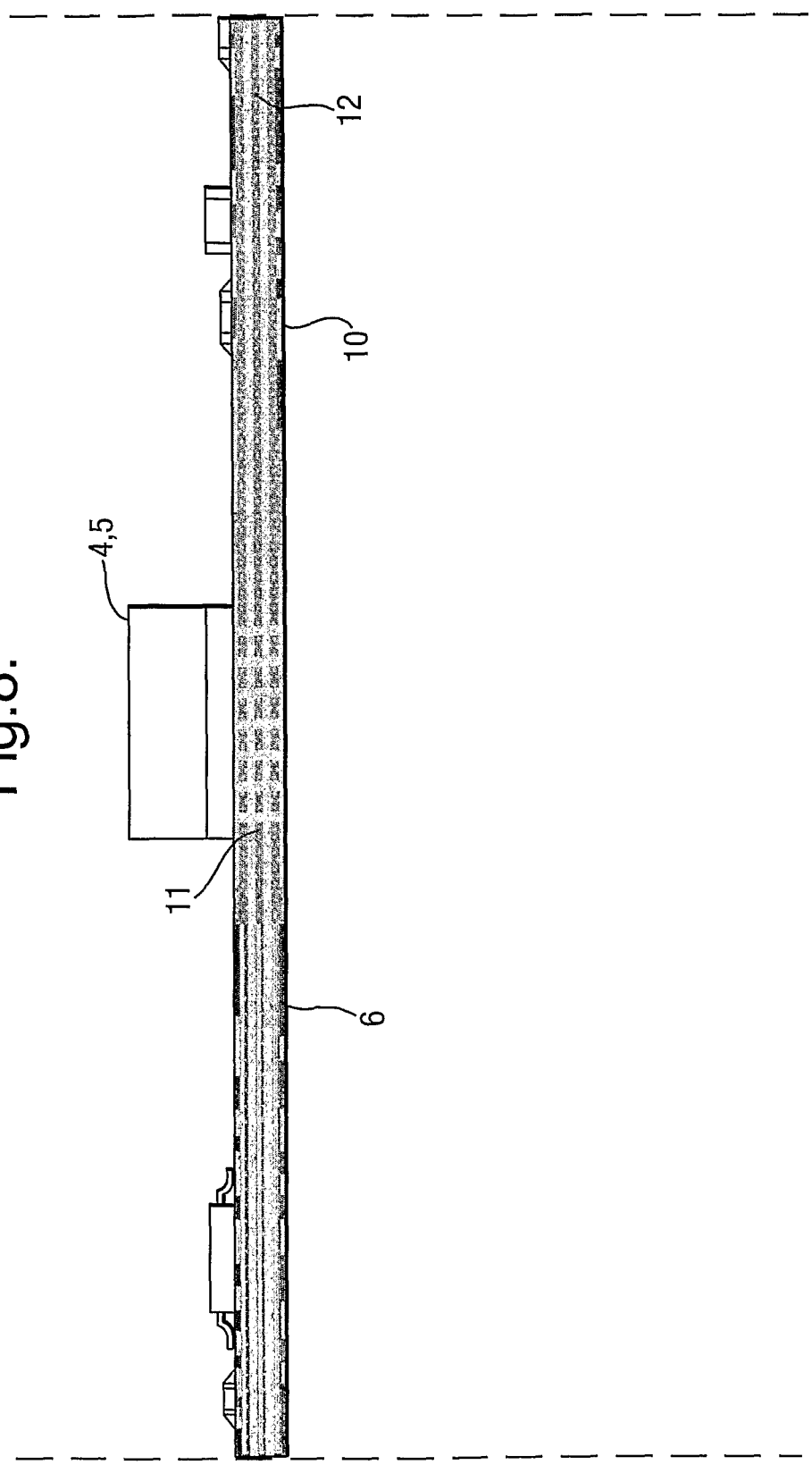

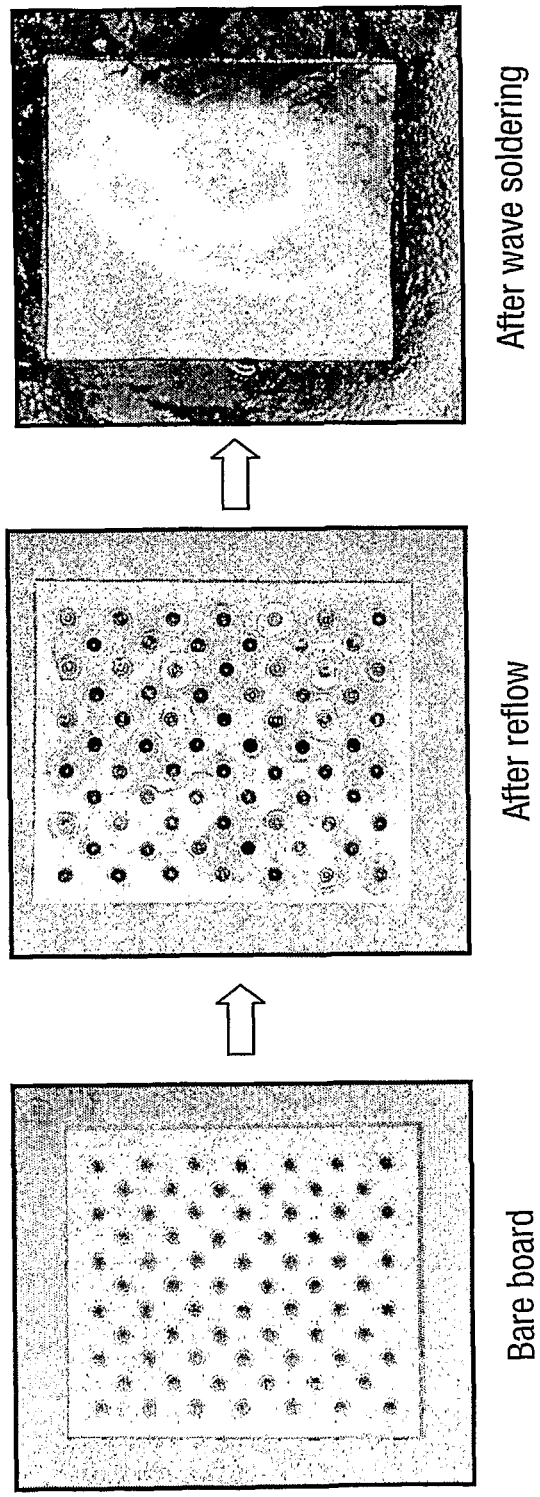

JUNCTION BOX

CROSS REFERENCE TO RELATED APPLICATIONS

The present application is the National Stage of International Application No. PCT/GB2008/003937, filed Nov. 26, 2008, entitled "JUNCTION BOX", which claims the benefit of Great Britain Patent Application No. 0723213.5, filed Nov. 27, 2007, entitled "JUNCTION BOX".

The present invention relates to a junction box. Junction boxes are provided in automotive vehicles as part of their electrical power distribution systems. They distribute electrical power to electrical circuitry via wire harnesses, which generally consist of a plurality of individually insulated wires bunched together, each wire connecting the junction box to electrical circuit, such as an electric motor, a switch or a lamp.

Modern junction boxes generally contain printed circuit boards (PCB) on which a large number of electronic circuitry are mounted, all of which need to be highly reliable to ensure safe and correct operation of the junction box under all conditions.

"Smart" junction boxes contain integrated signal processing circuitry, which signal many of the vehicle's functions, for example lighting, windscreen wipers and various sensors. Typical electronic circuitry will comprise switches, connectors, fuses, microcontroller and programmable elements to signal these functions. However, the high sensitivity of such circuitry means that it is very important to ensure that their temperatures are maintained within a safe working range at all times.

Generally, the smart junction box in an automotive vehicle requires both signal processing circuitry and power circuitry and it would be desirable for both the signal processing circuitry and the power circuitry to be distributed on the same PCB. However, in practice, the signal processing circuitry have had to be mounted on separate PCBs, not only to prevent them being damaged by the high temperatures generated by the power circuitry, but also because of the difficulty in mounting signal processing components, that usually have a fine pitch, on thick PCB tracks used for power transfer.

An object of the present invention is, therefore, to provide a PCB onto which can be mounted both the signal processing circuitry and the power circuitry, with the heat generated by the power circuitry being prevented from transferring to the signal processing circuitry.

According to the present invention there is provided a junction box, comprising a multi-layer circuit board, wherein the circuit board comprises: a plurality of dielectric layers, each having conducting track on a side and arranged one on top of another to form the multi-layered circuit board; power circuitry mounted on the circuit board; signal processing circuitry mounted on the circuit board; and a power input for inputting electrical power into the circuitry on the circuit board, wherein the electrical power is transferred through conducting track arranged to be on an inner dielectric layer, the conducting track on the inner dielectric layer being thicker than the conducting track arranged on the outer dielectric layers, and wherein the power circuitry is arranged on one region of the circuit board and the signal processing circuitry is arranged on another region of the circuit board, the two regions being thermally isolated by a thermal dam.

There are a number of advantages in enabling both the power circuitry and the signal processing circuitry to be incorporated onto a single PCB. For example, the manufacture of such a PCB requires a simpler production line and process, which results in the board being more reliable because there is less opportunity for errors to be introduced during its manufacture. A single PCB is also a simpler structure, which provides a reduction in weight and expensive materials such as copper, making it more cost effective.

The present invention suggests an arrangement whereby copper tracks are arranged within a multi-layer PCB in a manner contrary to standard industry teaching (IPC), resulting in a much improved ability of the PCB to dissipate heat away from circuitry whilst allowing for signal processing components to be mounted on the same board as power components.

For boards with higher copper content, the temperature rise of tracks arranged on inner layers will be lower than the temperature rise of outer tracks having the same track size and the same current. The standard industry teaching actually states the opposite results, which is only true for boards with low copper content. Therefore, in the present invention, the tracks which will dissipate the most heat, which are the tracks carrying the highest currents, are arranged on inner layers.

By constructing the PCB in this manner, the temperature rise on the power tracks of the PCB is reduced. An example of a PCB according to the present invention would have four layers, with the outer two layers having 2 oz copper track and the two inner layers having 4 oz copper track.

Heat transfer from the power region to the signal processing region on a PCB is further reduced in the present invention by the provision of a region of demarcation between the power region and signal processing region, which acts as a thermal dam, isolating the two regions and thereby reducing the transfer of heat generated by the power circuitry.

Accordingly, the heat transfer from the power circuitry to the signal processing circuitry can be reduced by an amount sufficient to allow a PCB to contain regions of both power circuitry and signal processing circuitry without the heat created by the power circuitry affecting the signal processing circuitry.

In addition, plated through holes used as thermal vias may be provided in the PCB, which pass through the layers, thereby allowing heat created by the components fitted on an external copper layer to dissipate to other copper layers (inner and outer). By filling these thermal vias with solder, the present invention has greatly improved the heat dissipation capability of the PCB.

An example of the present invention will now be described in detail with reference to the accompanying drawings, in which.

Figure 4:
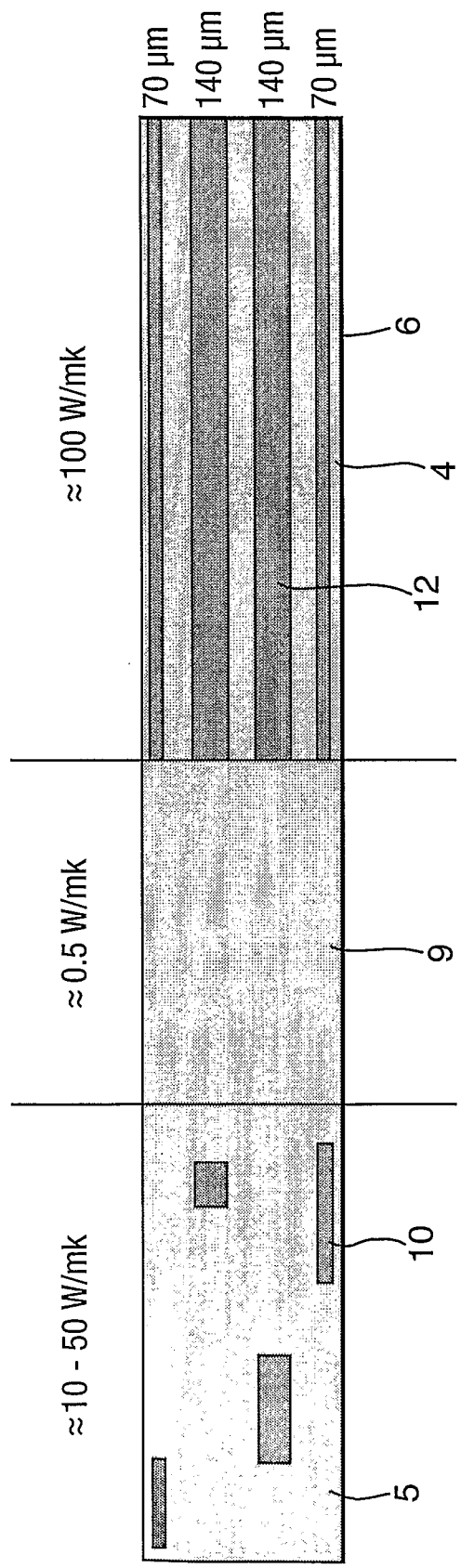
Figure 5A:
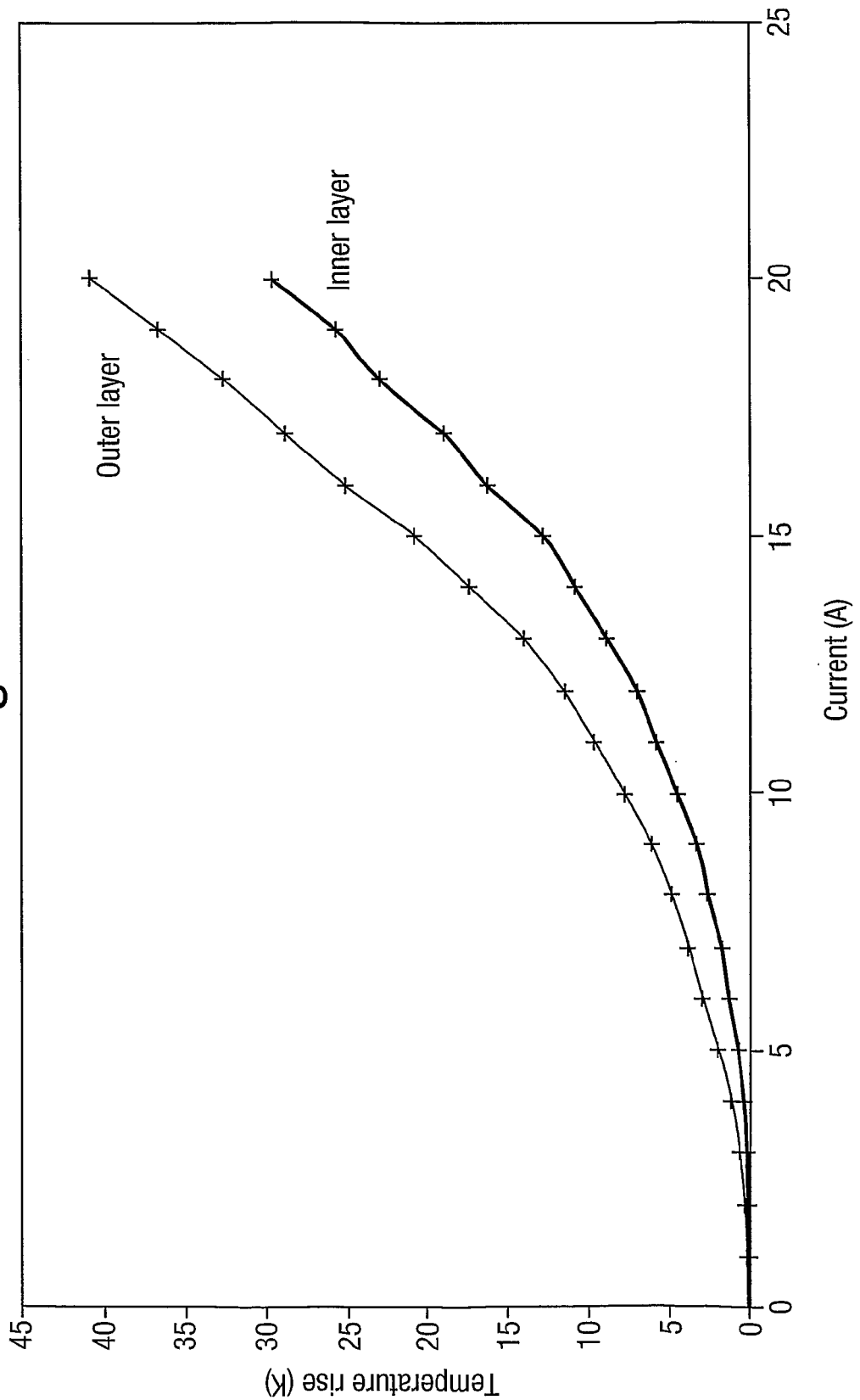
Figure 5B:
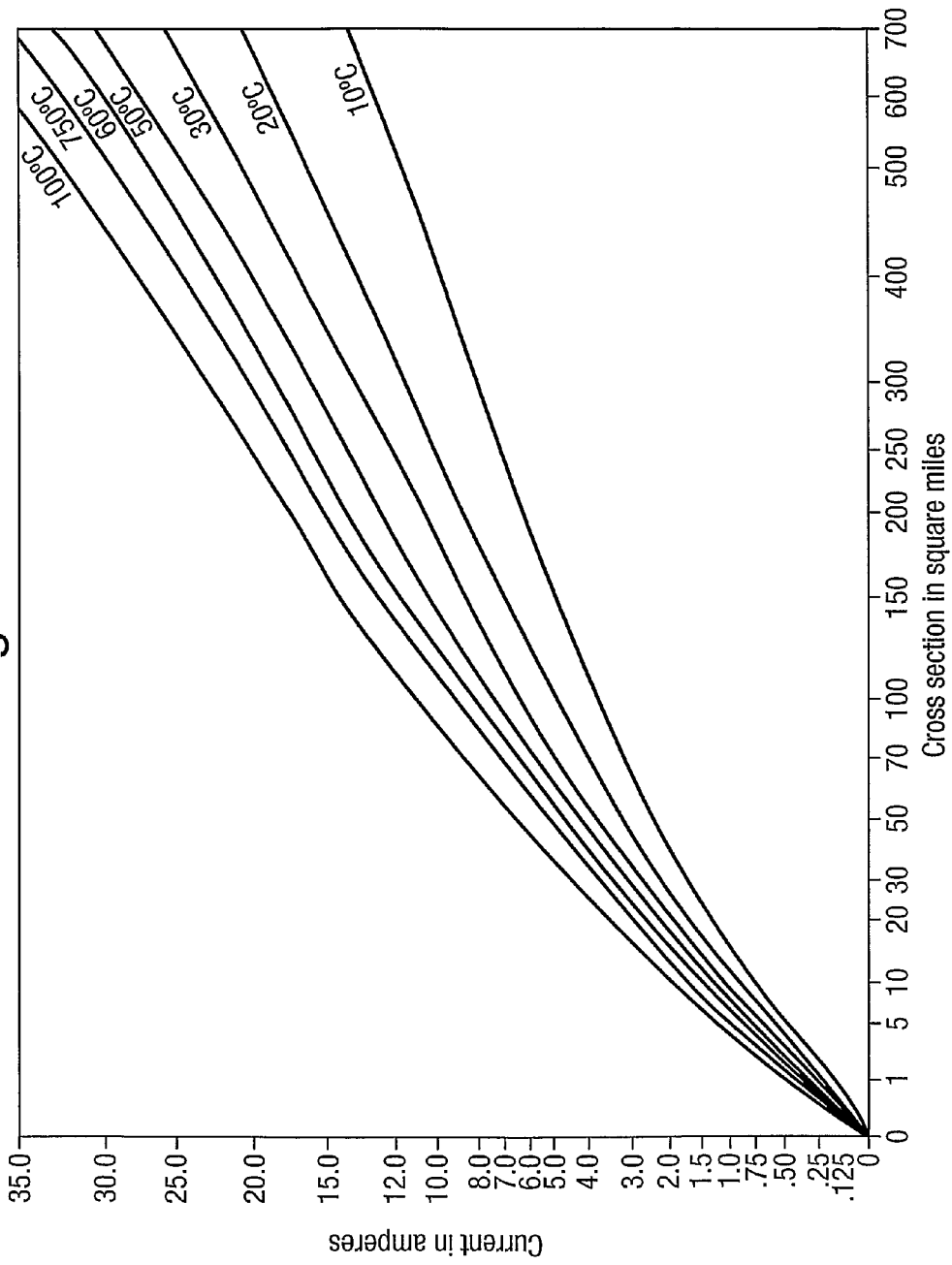
Figure 7A:
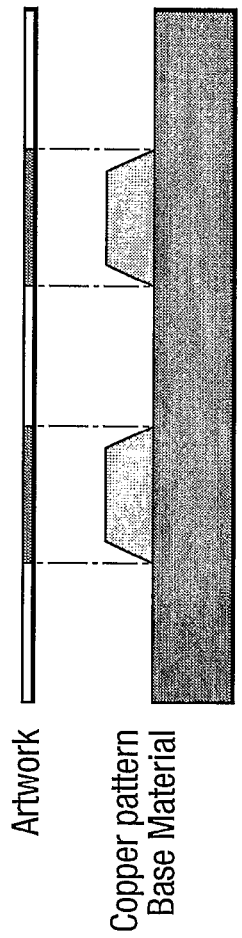
Figure 7B:
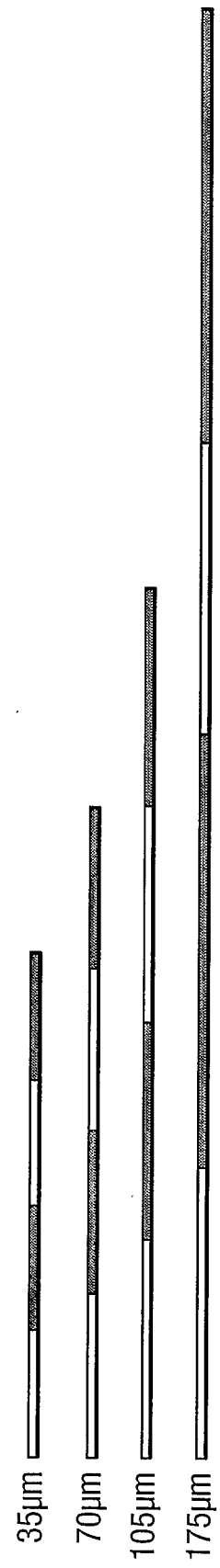

FIG. 4 gives evaluations of the different thermal conductivities of a multilayer PCB carrying both power circuitry and signal processing circuitry, with a thermal dam separating the two regions;

FIG. 5A is a graph illustrating how the temperature rise of copper track on an outer layer of a multilayer PCB compares with the temperature rise of the copper track of same dimension on an inner layer of the same multilayer PCB, for a given current;

FIG. 5B is a chart showing temperature rise for copper track on an outer layer according to standard industry teaching (IPC) data;

FIG. 5C is a chart showing temperature rise for copper track on an inner layer according to standard industry teaching (IPC) data;

FIG. 6A is a cross-section of a multi-layer PCB, illustrating the power dissipation when the power track is on an external layer;

FIG. 6B is a cross-section of a multi-layer PCB, illustrating the power dissipation when the power track is on an internal layer;

FIGS. 7A and 7B show how microprocessor pitch can vary with PCB copper thickness/weight;

FIG. 8 illustrates how thermal vias and copper track can be used to dissipate heat generated by circuitry mounted on a board; and FIG. 9 shows examples of different methods of filling thermal vias with solder to lower the thermal resistance in a PCB.

The invention relates in particular to a printed circuit board (PCB), to be used in "smart" junction boxes (not shown) employed in the automotive industry. The present invention provides a means for being able to accommodate both power and signal processing circuitry on a multi-layer PCB.

Figure 1A:
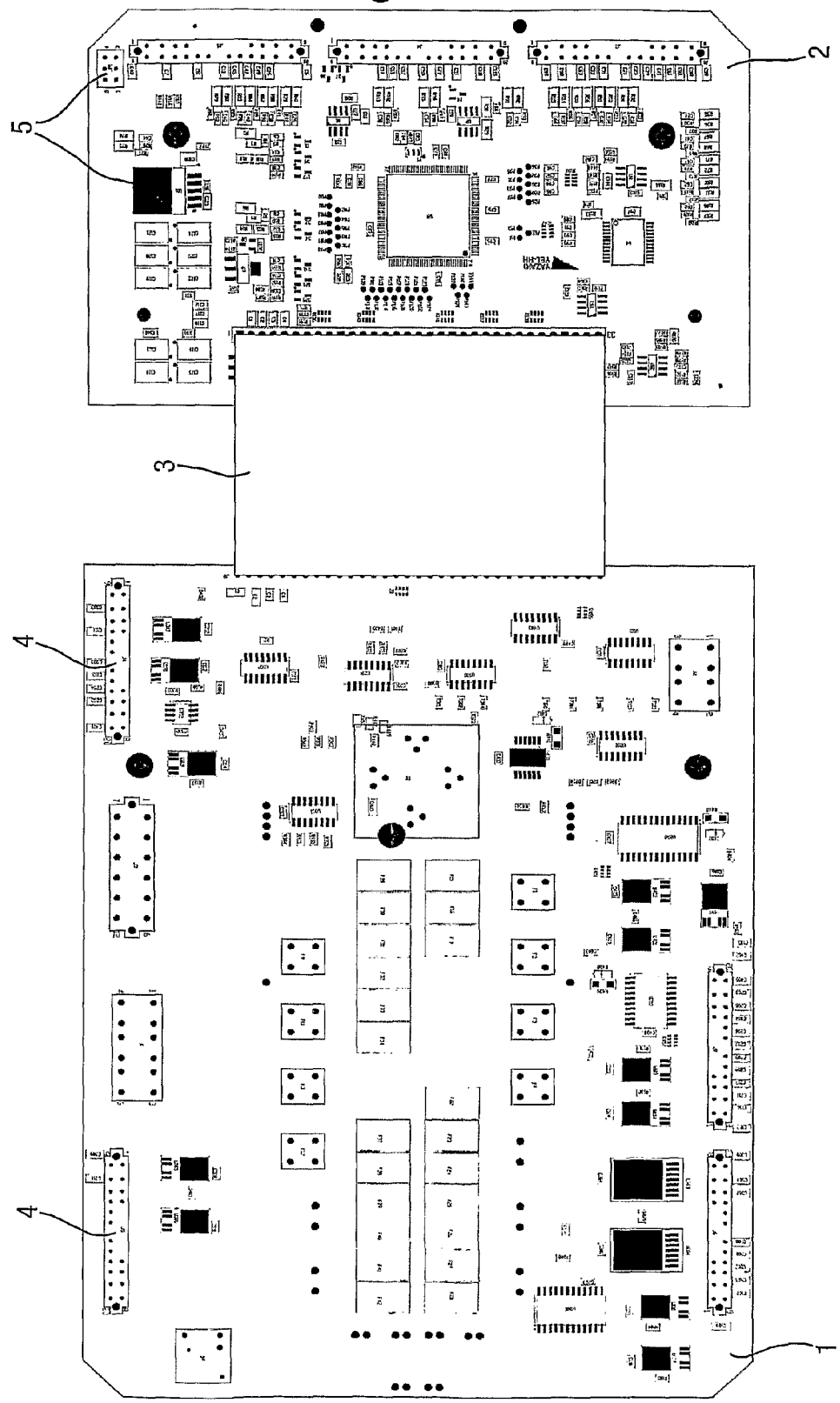
FIG. 1A shows an example of a dual board PCB arrangement previously used in smart junction boxes, whereby the power circuitry are mounted on one PCB and the signal processing circuitry are mounted on a separate PCB, the two PCBs being electrically connected.

FIG. 1A shows a typical example of an arrangement of two PCBs 1, 2 for use in a junction box according to the prior art. The two PCBs 1, 2 are electrically connected by an electrical strap 3. The first PCB is the power PCB 1 and has power circuitry 4 mounted on it. The second PCB is the signal processing PCB 2 and has signal processing circuitry 5 mounted on it.

The power PCB 1 of the prior art, has generally thicker copper than the signal processing PCB 2 because the power PCB 1 and power circuitry 4 usually drive high currents and the PCB must, therefore, be able to accommodate this. An example of the construction of a prior art power PCB 1 might be a PCB having four layers, each having 3 oz copper track to help limit the generated heat in the tracks.

Previously, the signal processing circuitry 5 has been mounted on a separate signal processing PCB 2 to the power circuitry 4, as shown in FIG. 1A. One of the main reasons for this is that it prevents the heat generated by the power circuitry 4 affecting the signal processing circuitry 5. Another reason is the difficulty in mounting signal processing circuitry 5 onto track used for power transfer as this track is generally too thick to be able to be formed at a pitch small enough for the pitch of the pins usually found on signal processing circuitry 5.

Figure 1B:
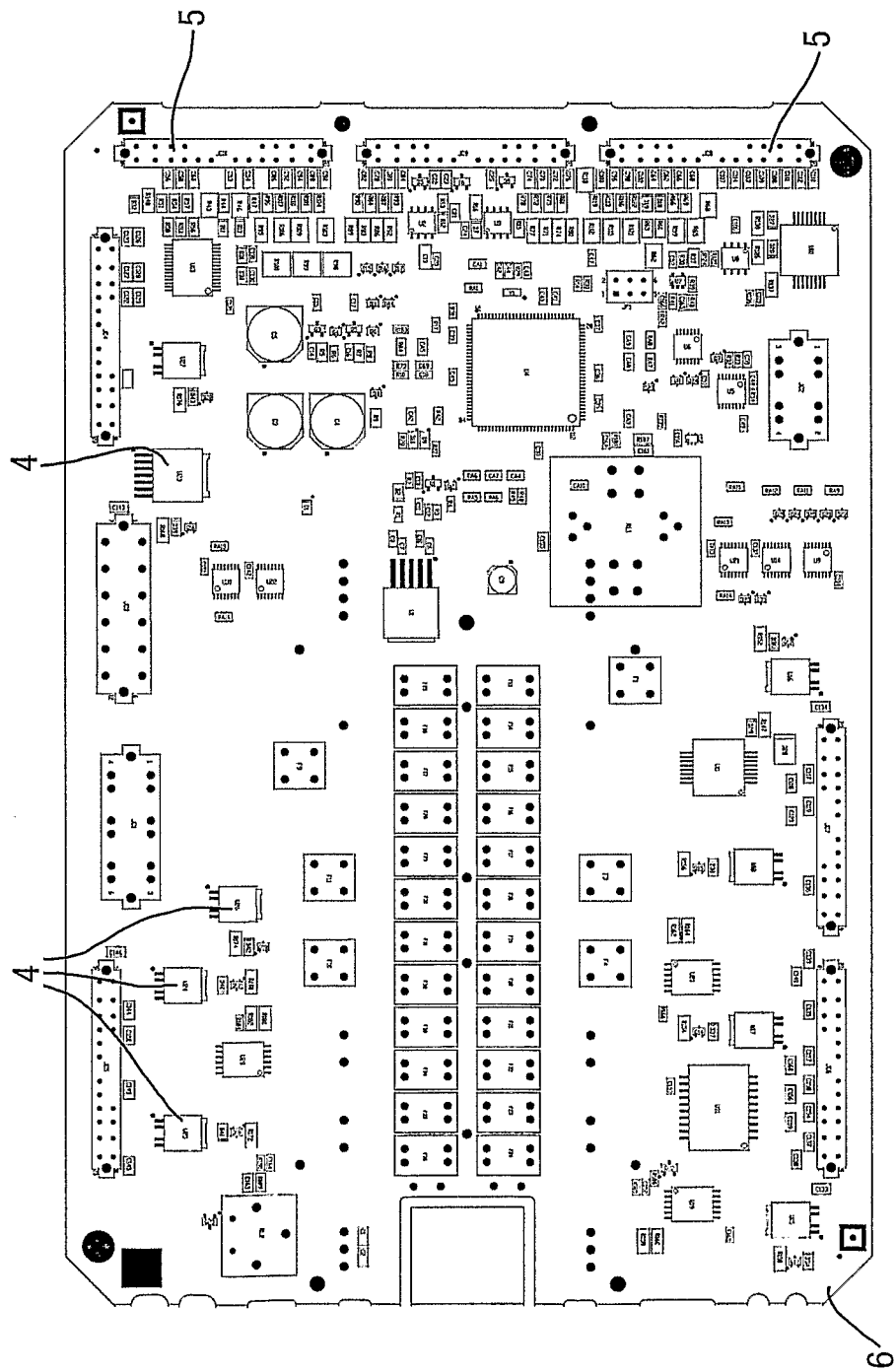
FIG. 1B shows an example of a circuit board according to the present invention containing both the power circuitry and the signal processing circuitry.

FIG. 1B shows an example of the present invention, a multi-layer PCB 6, having both power circuitry 4 and signal processing circuitry 5 mounted on it for use in a junction box (not shown). In this example, FR4 dielectric layer is used to construct a multilayer PCB comprising four copper layers. It will be appreciated however that, although FR4 is discussed as being used in this particular example, any suitable PCB dielectric material could be used.

Figure 2:
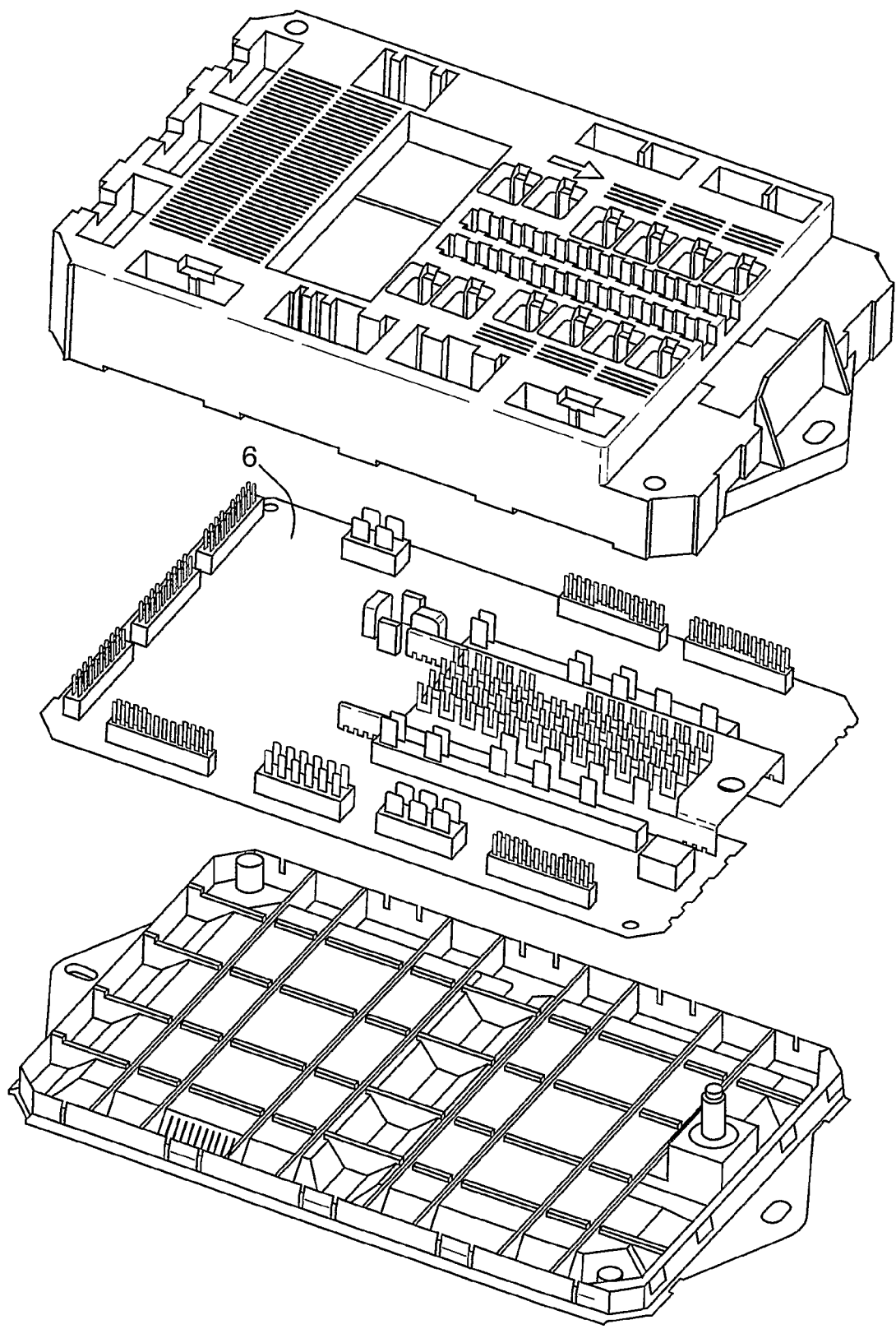
FIG. 2 shows an exploded view of a junction box comprising a PCB according to the present invention.
Figure 3:
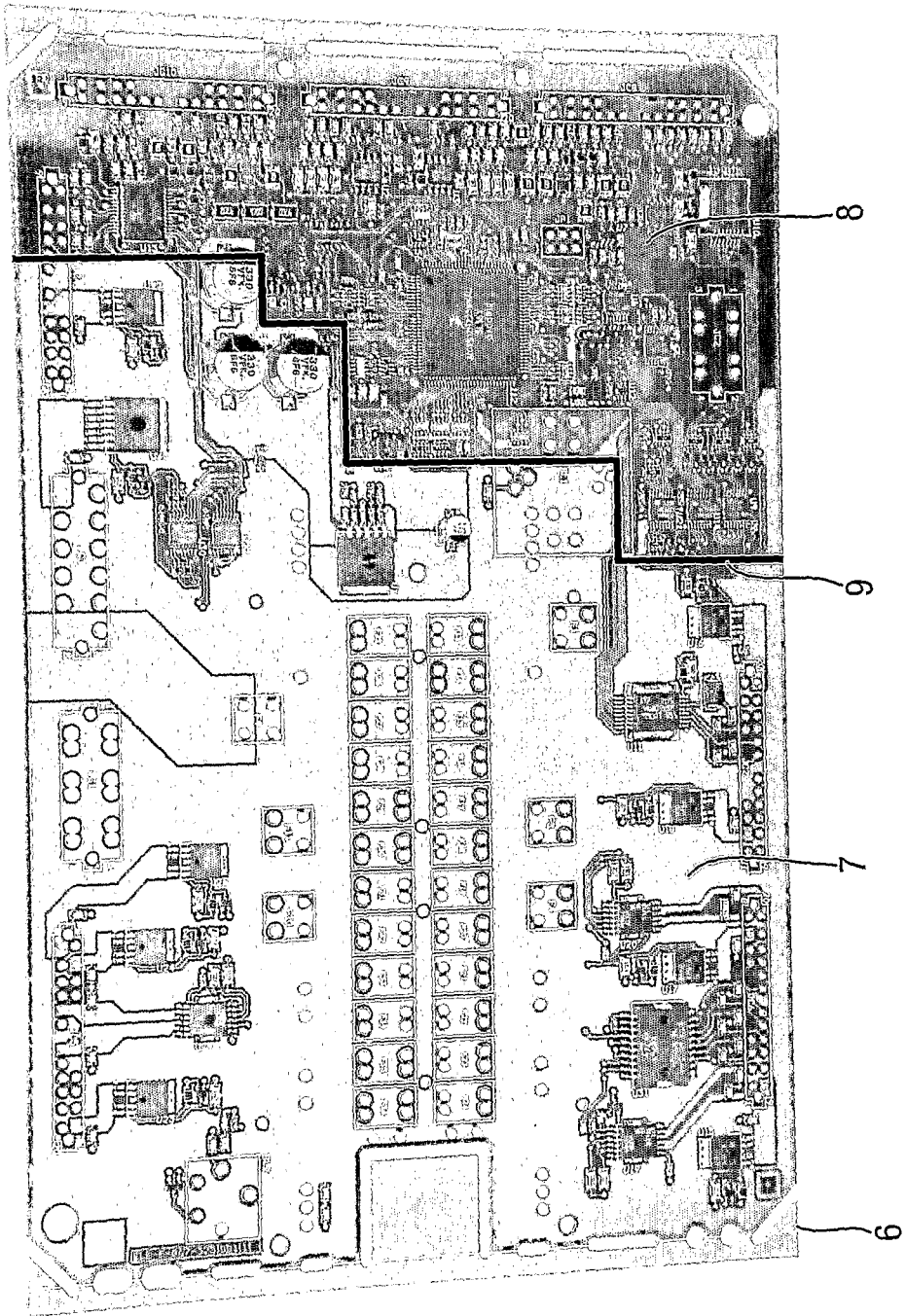
FIG. 3 shows the circuit board of FIG. 1B and the path of a thermal dam which separates the power circuitry and signal processing circuitry regions.

FIG. 2 shows an exploded view of a junction box comprising a single multilayer PCB 6 according to the present invention. FIG. 3 shows the top surface of the PCB 6 where the power circuitry 4 is mounted on a region having high copper coverage, from hereon called the power region 7, and the signal processing circuitry 5 being mounted on a region of the PCB 6 having low copper coverage, from hereon called the signal processing region 8.

The two regions 7, 8 are separated by a region of demarcation, which will be referred to from hereon in as a thermal dam 9. The thermal dam 9 provides thermal isolation between the two regions 7, 8 and will be explained in more detail later. The path of an example thermal dam 9 across a PCB 6 can be seen in FIG. 3, where it separates the power region 7 from the signal processing region 8. A further example of a thermal dam 9 is illustrated in FIG. 4, where it can be seen more clearly how a thermal dam 9 may be arranged to separate power circuitry 4 from signal processing circuitry 5.

The thermal conductivity of copper is approximately 400 W/mK and the thermal conductivity of FR4 dielectric board is approximately 0.23 W/mK. It will be appreciated by a skilled person that the less copper there is present within the thermal dam 9, the less heat will be transferred between the power and signal processing regions 7, 8 through the PCB 6.

FIG. 4 is an illustration of an ideal thermal dam 9, having no copper track on any of the dielectric layers provided within the thermal dam 9. In practice, a small amount of copper track is provided in at least one of the layers of the thermal dam 9 in order to electrically connect the power circuitry 4 to the signal processing circuitry 5 and to ensure a good level of Electro-Magnetic Compatibility (EMC).

According to an example of the present invention, the effective thermal conductivity of the power region 7 of the PCB 6 is around 100 W/mK, taking into consideration the combined conductivities of the copper and the FR4 dielectric board. In comparison, the signal processing region 8 has less than half the effective thermal conductivity, at around 10-50 W/mK. The effective thermal conductivity of the thermal dam 9, having minimal copper track (comprising only FR4 dielectric board), is around 0.5 W/mK.

An example of an arrangement of dielectric layers according to the present invention is shown in FIG. 4, which illustrates an example of a multi-layer PCB 6 having 2 oz (70 μm) copper track 10 on the two outer dielectric layers and 4 oz (140 μm) copper track 12 on the two inner dielectric layers, i.e. a 2-4-4-2 arrangement. Whilst, it will be appreciated that other combinations of copper track thicknesses can be used on the inner and outer dielectric layers, the above example allows for good heat dissipation whilst minimising overall PCB copper weight and, hence, cost.

Considering now the improved heat dissipation aspect of the present invention, FIG. 5A is a plot of temperature (K) vs. current (A). This chart shows that, for a given current, the temperature of copper track 12 on inner dielectric layers of a multi-layer PCB 6 does not increase as much as the temperature of copper track 10 on outer dielectric layers of the same PCB 6, where the copper track is of the same thickness. This is contrary to standard industry teaching (IPC) as can be seen from the standard industry references shown in FIGS. 5B and 5C.

Accordingly, since for any given current the temperature rise of an inner dielectric layer is considerably less than that of an outer dielectric layer for a PCB 6 having high copper coverage, the present invention is arranged such that the tracks that transfer the highest current, and hence have the greatest potential for temperature increase, are arranged on the inner layers.

FIGS. 6A and 6B show the advantage of arranging the dielectric layers so that the thicker copper track 12, which carries the highest current, is arranged on the inner dielectric layers.

In the arrangement of FIG. 6A, the energy (heat) transfer from the top surface of a trace direct to air is the least efficient, air only having a thermal conductivity of 0.024 W/mK. The heat transfer from the component trace to air greatly reduces the potential heat transfer possible from the component.

In FIG. 6B, in contrast, the energy transfer (heat) is much more efficient, the heat being transferred away from the PCB trace via the adjacent copper traces and dielectric on all sides, with copper having a thermal conductivity of approximately 400 W/mK, as mentioned before.

One of the reasons it has previously not been possible to mount both the power circuitry 4 and signal processing circuitry 5 on the same PCB 6 was due to the heat generated by the power circuitry 4 affecting the signal processing circuitry 5 when in close proximity, as is the case considering a PCB of the size typically required for use in a junction box.

However, as mentioned previously, the present invention makes this desirable arrangement possible by providing a much improved means for dissipating heat from the power circuitry 4 in combination with a new approach to reducing the thermal conductivity between the power region 7 of the PCB 6 and the signal processing region 8 by the inclusion of a thermal dam 9. This has the beneficial effect of preventing the heat generated by the power circuitry 4 from reaching and adversely affecting the performance of the heat sensitive signal processing circuitry 5.

The much improved means for dissipating heat involves constructing the PCB 6 in a manner that contradicts standard industry teaching (IPC) in the way that its layers are arranged. However, this contradictory arrangement assists the PCB 6 in dissipating heat away from the power circuitry 4 at a rate sufficient to allow the power circuitry 4 to be placed on the same PCB as the signal processing circuitry 5.

IPC standards, which are the results of industry consensus and collaboration, are respected throughout the whole world and, concerning the construction of multilayer PCBs, it is understood and taught that for a multi-layer PCB having similar tracks on the inner and outer dielectric layers, temperature rise due to current passing along the tracks on the outer dielectric layers will be less than the temperature rise on the inner dielectric layers (see FIGS. 6B and 6C). However, this has been found to be true only for PCBs with low copper coverage.

The PCB 6 of the present invention moves away from conventional thinking in that, in contrast to IPC standards, the multi-layer PCB 6 is arranged such that the heavier copper tracks 12 that carry the high power for the circuitry are located on the inner dielectric layers of the PCB. This is because it has been determined that, for a multi-layer PCB having high copper coverage and similar tracks on both the inner and outer dielectric layers, the temperature increase on the inner dielectric layers due to current passing along the tracks will be less than the temperature rise on the outer dielectric layers.

Therefore by placing the high power tracks on the inner dielectric layers of the PCB 6 it is possible to keep the temperature increases caused by the heat generated by the power circuitry 4 down to a minimum, with the copper track also acting as very good thermal conductors to dissipate heat away from the circuitry. Of course, it will be appreciated that different thicknesses of copper track can be used in the different dielectric layers of the PCB 6, as long as the basic principle of providing the thicker copper track 12 on the inner dielectric layers is maintained.

The 2 oz copper track 10 on the outer dielectric layers, with 4 oz copper track 12 on the inner dielectric layers (2-4-4-2), arrangement discussed previously is simply one arrangement, which provides the necessary heat dissipation required for a PCB having the particular circuitry used in a junction box. This particular arrangement is considered to allow good heat dissipation whilst keeping the overall copper weight of the PCB 6, and hence cost, to a minimum.

The thickness of the copper tracks provided on the various dielectric layers of the PCB 6 can be varied according to performance requirements, which could include factors such as budget and the amount of heat being generated by the power circuitry 4.

Considering now the thermal dam 9, described above, in more detail, copper fill is a technique used on PCBs to extend the life of copper etchant and improve thermal performance.

Generally, a PCB having high copper coverage will have improved thermal performance, in contrast with a PCB having low copper coverage, which will have improved voltage isolation, creepage and clearance performance. It is also important to have a good balance of copper coverage on the surface of a PCB as this facilitates reliable manufacture and improves yield.

The power region 7 of the PCB is provided with maximum copper fill and hence high copper coverage, whilst the signal processing region 8 of the PCB 6 has minimal copper fill and therefore low copper coverage in comparison.

The PCB copper coverage is segmented into regions and provides a thermal dam 9 between the power region 7 and signal processing region 8 on the PCB 6 surface, which has the desirable effect of reducing the thermal conductivity between the power region 7 and the signal processing region 8 of the PCB 6 and hence limiting the amount of heat transferred between the two regions 7, 8.

The width of the thermal dam 9 separating the power and signal processing regions 7, 8 containing the various power circuitry 4 and signal processing circuitry 5, respectively, can be varied, depending at least on the size requirements of the PCB 6 and the amount of circuitry required to be mounted on it. A skilled person will understand that the wider the thermal dam 9, the better the thermal isolation of the power and signal processing regions 7, 8 from one another.

Although the preferred embodiment uses FR4 dielectric for the PCB 6, a skilled person will appreciate that the dielectric board used is not limited to any one particular type. Indeed, there are numerous types of dielectric board available, having similar properties to FR4, which would be suitable for use with the present invention.

Track pitch can vary with PCB copper thickness. Due to the PCB etching process, as the copper weight on a layer increases, the differential between the width of a circuitry pad created by its upper (circuitry) edge and the width of its lower (dielectric) edge also increases. The result of this is that as copper weight increases, the minimum distance between circuitry pads (circuitry pin pitch) also increases. FIG. 7A illustrates the artwork track width/isolation definition and FIG. 7B shows examples of the minimum artwork track width and minimum artwork track isolation for different copper weights.

When tracks are etched on a PCB surface, they are generally trapezoid shaped as a result of the sides of the tracks being etched away. To reliably seat integrated circuit (IC) components onto a track, it is necessary for the track to have a width sufficient to accommodate the pins provided on the IC components for such a purpose.

In particular, when etching high copper weight power tracks, to ensure that there is a suitable mounting surface provided on a pad for an integrated circuit, it is necessary for the base of that pad to be considerably wider than the desired mounting surface. The severity of this effect increases with the PCB copper weight.

By arranging the PCB 6 so that the high copper weight power tracks are located on the inner layers, the present invention allows the use of fine pitch components on the outer layers of the PCB 6 for the signal processing circuitry 5.

If tracks, and hence components, are placed too close together on an outer surface of a PCB, there is a risk that the occurrence of voltage creepage, which increases the closer the tracks are to one another, may affect the PCB performance. However, by having the high power connections arranged on an internal layer, the occurrence of voltage creepage is greatly reduced by the presence of the dielectric on the inner layers.

Conversely it is beneficial for thermal conduction to be able to have the tracks placed closely together on an inner layer of the PCB, as it is desirable to have minimal isolation for good heat spreading.

The present invention therefore provides a new PCB design technique that targets internal copper layers for high power connections. One benefit of this is improved thermal performance, resulting in better heat dissipation, which leads in turn to the PCB 6 and circuitry 4, 5 having a lower temperature rise during operation.

To achieve the desired improved thermal performance, high copper weight is provided on internal routing layers, with a lower copper weight being provided on the external copper layers. This permits integration of power circuitry 4 and signal processing circuitry on a single PCB 6, the PCB having improved thermal performance for a given copper weight over prior art designs.

As a result of the improved thermal performance and the copper segregation created by the signal processing region 8 of the PCB having no copper fill, the temperature differential between the power region 7 and the signal processing region 8 of the PCB 6 is increased, which allows the signal processing region 8 to be less affected by the potentially high temperature of the power region 7.

Another feature of the present invention, which increases the thermal performance of the PCB 6 is that it is provided with thermal vias 11, which are filled with solder. FIG. 8 illustrates the use of thermal vias 11 to dissipate heat generated by power and signal processing circuitry 4, 5 mounted on a PCB 6 using the copper tracks 10, 12. This is a basic heat transfer principle, which the present invention has improved upon.

FIG. 9 shows an example of solder being introduced to thermal vias by combined reflow and wave soldering techniques, wherein the thermal vias are ideally entirely filled by the solder. Having solder filled thermal vias can improve the thermal performance of the PCB by up to 60%, compared to bare board performance, by reducing thermal resistance through the layers. This in turn results in the power and signal processing circuitry operating at reduced temperatures.

Furthermore, the utilisation of fuses, relays and intelligent MOSFETs result in a relatively small PCB surface region and consequently minimises the overall dimensions of the smart junction box.

The invention claimed is:

1. A junction box, comprising a multi-layer circuit board, wherein the circuit board comprises:
a plurality of dielectric layers, each having conducting track on a side and arranged one on top of another to form the multi-layered circuit board with a plurality of inner dielectric layers and first and second outer dielectric layers along an exterior of the circuit board, wherein the conducting tracks of the respective first and second outer dielectric layers are positioned on a side of the respective first and second outer dielectric layers facing toward an interior of the circuit board and toward the plurality of inner dielectric layers;
power circuitry directly mounted on the circuit board;
signal processing circuitry directly mounted on the circuit board; and
a power input for inputting electrical power into the circuitry on the circuit board,
wherein the electrical power is transferred through a conducting track arranged to be on an inner dielectric layer, the conducting track on the inner dielectric layer being thicker than the conducting track arranged on the outer dielectric layers;
the power circuitry is arranged on a power circuitry region of the circuit board and the signal processing circuitry is arranged on a signal processing circuitry region of the circuit board;
a thermal dam including the plurality of dielectric layers, the thermal dam being positioned between the power circuitry region of the circuit board and the signal processing circuitry of the circuit board to thermally isolate the power circuitry region from the signal processing circuitry of the circuit board, electro-magnetic compatibility (EMC) performance of the circuit board is maintained by the presence of a conducting material between the two regions on the circuit board such that the thermal dam contains less than 10% of the conducting material than the power circuitry region of the circuit board; and
wherein the signal processing circuitry region has a copper coverage and the power circuitry region has a higher copper coverage than the copper coverage on the signal processing circuitry region.

2. The junction box according to claim 1, wherein the thermal dam passes through all the layers of the circuit board.

3. The junction box according to claim 1, wherein the thermal dam on any individual layer has a minimum width of 1 mm.

4. The junction box according to claim 3, wherein the circuit board comprises four dielectric layers.

5. The junction box according to claim 4, wherein the outer dielectric layers have 2 oz conducting track and the inner dielectric layers have 4 oz conducting track.

6. The junction box according to claim 1, wherein thermal vias are provided through the multilayer printed circuit board, the vias being filled with solder.

7. The junction box according to claim 6, wherein the solder is introduced to the vias using a reflow or wave soldering technique, or a combination of both.

8. The junction box according to claim 1, wherein the power and signal processing circuitry on the printed circuit board comprises any of fuses, relays, MOSFETS, microcontroller and programmable elements.

9. The junction box according to claim 1, further comprising a programmable element.

10. The junction box according to claim 1, wherein the power input is a bus bar.

11. A junction box, comprising a multi-layer circuit board, wherein the circuit board comprises:
a plurality of dielectric layers, each having conducting track on a side and arranged one on top of another to form the multi-layered circuit board with a plurality of inner dielectric layers and first and second outer dielectric layers along an exterior of the circuit board, wherein the conducting tracks of the respective first and second outer dielectric layers are positioned on a side of the respective first and second outer dielectric layers facing toward an interior of the circuit board and toward the plurality of inner dielectric layers;

power circuitry mounted on the circuit board;

signal processing circuitry mounted on the circuit board for routing signals; and a power input for inputting electrical power into the circuitry on the circuit board, wherein the electrical power is transferred through conducting track arranged to be on an inner dielectric layer and the signal routing is on the conducting track on the outer dielectric layer, the conducting track on the inner dielectric layer being thicker than the conducting track arranged on the outer dielectric layers, and wherein the power circuitry is arranged on power circuitry region of the circuit board and the signal processing circuitry is arranged on signal processing circuitry region of the circuit board;

a thermal dam including the plurality of dielectric layers, the thermal dam being positioned between the power circuitry region of the circuit board and the signal processing circuitry of the circuit board to thermally isolate the power circuitry region from the signal processing circuitry of the circuit board, and electro-magnetic compatibility (EMC) performance of the circuit board is maintained by the presence of a conducting material between the two regions on the circuit board such that the thermal dam contains less than 10% of the conducting material than the power circuitry region of the circuit board.

12. The junction box according to claim 11, wherein the signal processing circuitry region has a copper coverage and the power circuitry region has a higher copper coverage than the copper coverage on the signal processing circuitry region.

13. The junction box according to claim 11, wherein the thermal dam passes through all the layers of the circuit board.

14. The junction box according to claim 11, further comprising a programmable element.

15. The junction box according to claim 11, wherein the power input is a bus bar.

* * * * *